US008841568B2

(12) United States Patent
Dai

(10) Patent No.: US 8,841,568 B2
(45) Date of Patent: Sep. 23, 2014

(54) ELECTRONIC DEVICE WITH POWER SWITCH

(75) Inventor: Bin Dai, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 156 days.

(21) Appl. No.: 13/291,205

(22) Filed: Nov. 8, 2011

(65) Prior Publication Data

US 2012/0325638 A1 Dec. 27, 2012

(30) Foreign Application Priority Data

Jun. 22, 2011 (CN) .......................... 2011 1 0169325

(51) Int. Cl.
*H01H 1/14* (2006.01)
*H01H 13/12* (2006.01)
*H01H 13/14* (2006.01)
*H01H 13/86* (2006.01)
*H05K 5/00* (2006.01)

(52) U.S. Cl.
CPC ......... *H01H 13/86* (2013.01); *H01H 2221/044* (2013.01); *H01H 2229/028* (2013.01); *H01H 2235/018* (2013.01); *H01H 2223/022* (2013.01); *H05K 5/0017* (2013.01)
USPC ............ 200/341; 200/345; 200/292; 200/534

(58) Field of Classification Search
CPC .......... H01H 1/14; H01H 13/12; H01H 13/14
USPC ................................. 200/345, 341, 292, 534
See application file for complete search history.

(56) References Cited

U.S. PATENT DOCUMENTS 5,763,841 A * 6/1998 Hasunuma .................... 200/5 A
6,586,689 B2 * 7/2003 Kuriyama ..................... 200/6 A
2009/0095613 A1 * 4/2009 Lin .............................. 200/536
2010/0243422 A1 * 9/2010 Arihara et al. ................ 200/600

* cited by examiner

*Primary Examiner* — Edwin A. Leon
*Assistant Examiner* — Ahmed Saeed
(74) *Attorney, Agent, or Firm* — Novak Druce Connolly Bove + Quigg LLP

(57) ABSTRACT

An electronic device includes a housing defining a receiving hole, and a power switch positioned on the housing. The power switch includes an operating button received in the receiving hole, an elastic member fixed to the operating button via an adhesive member, a printed circuit board, and a support member. The support member is connected to the printed circuit board and fixed to the housing, such that the elastic member is sandwiched between the operating button and the printed circuit board

15 Claims, 4 Drawing Sheets

ELECTRONIC DEVICE WITH POWER SWITCH

BACKGROUND

1. Technical Field

The present disclosure generally relates to electronic devices, and particularly, to an electronic device with a power switch.

2. Description of the Related Art

An electronic device generally has a power switch for turning the electronic device on/off. The electronic device includes a housing defining a receiving hole, and the power switch is received in the receiving hole. The power switch includes an operating button, a printed circuit board, and an elastic piece, in which the elastic piece is installed between the operating button and the printed circuit board. When the operating button is pressed to connect the electrical contacts of the printed circuit board, the electronic device turns on. In assembly of the power switch to the housing, the operating button is inserted into the receiving hole, and the elastic piece is fixed to the housing, such that that the elastic piece is between the operating button and the printed circuit board. However, in the assembly process of the power switch, the technician requires to align the operating button with the elastic piece, and fix the elastic piece to the housing by hand, therefore, the assembly precision is low, and it consumes a significant amount of time to assemble the operating button to the housing.

Therefore, there is room for improvement within the art.

BRIEF DESCRIPTION OF THE DRAWING

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
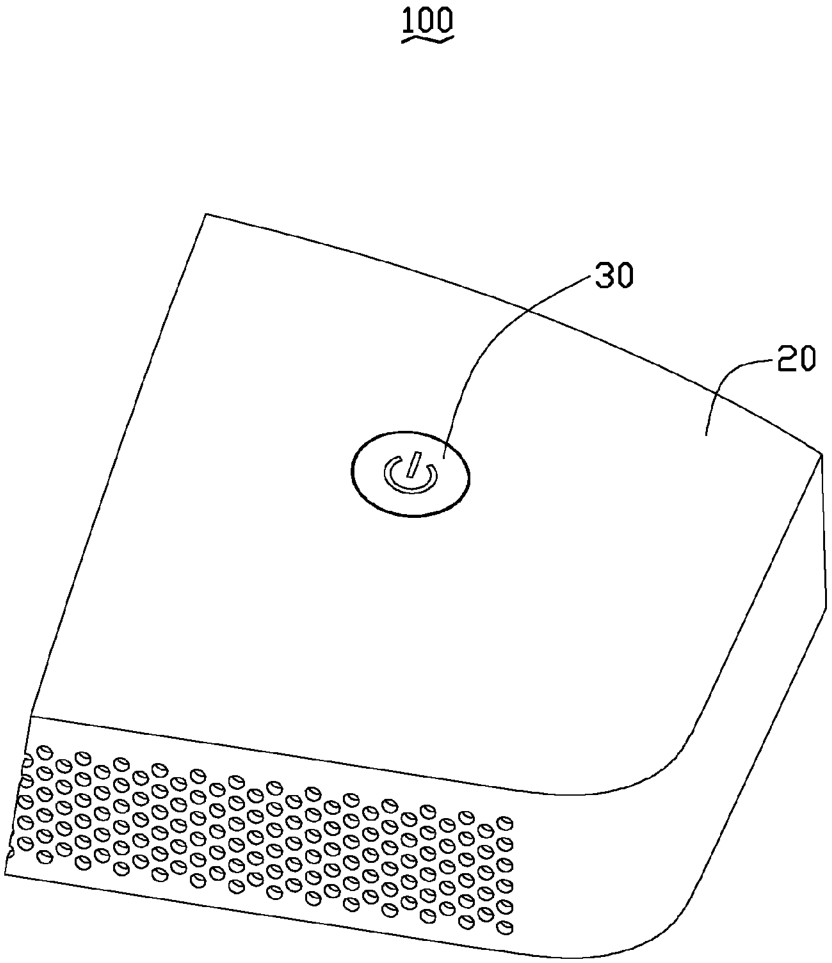
FIG. 1 is a partial, isometric view of an embodiment of an electronic device.
Figure 2:
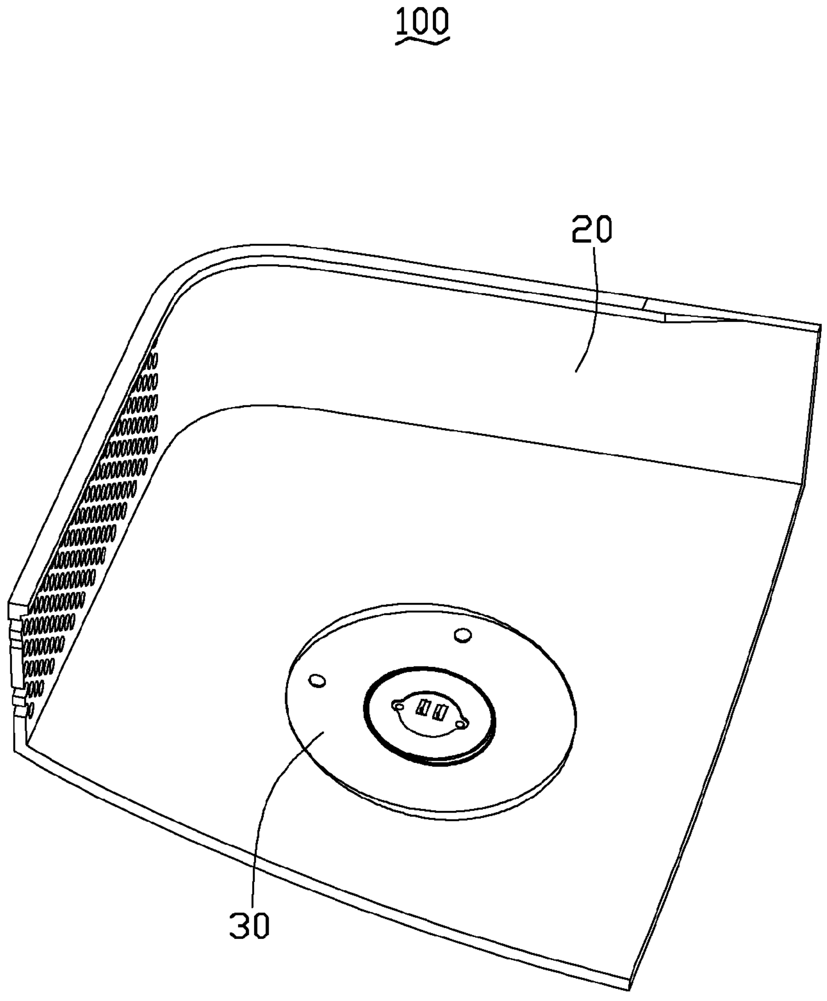
FIG. 2 is similar to FIG. 1, but viewed from another aspect.

Referring to FIGS. 1 and 2, an embodiment of an electronic device 100 includes a housing 20 and a power switch 30 installed and positioned on the housing 20. The electronic device 100 includes various modules for performing specific functions and features. However, for simplicity, only the module related to the power switch 30 is described herein.

Figure 3:
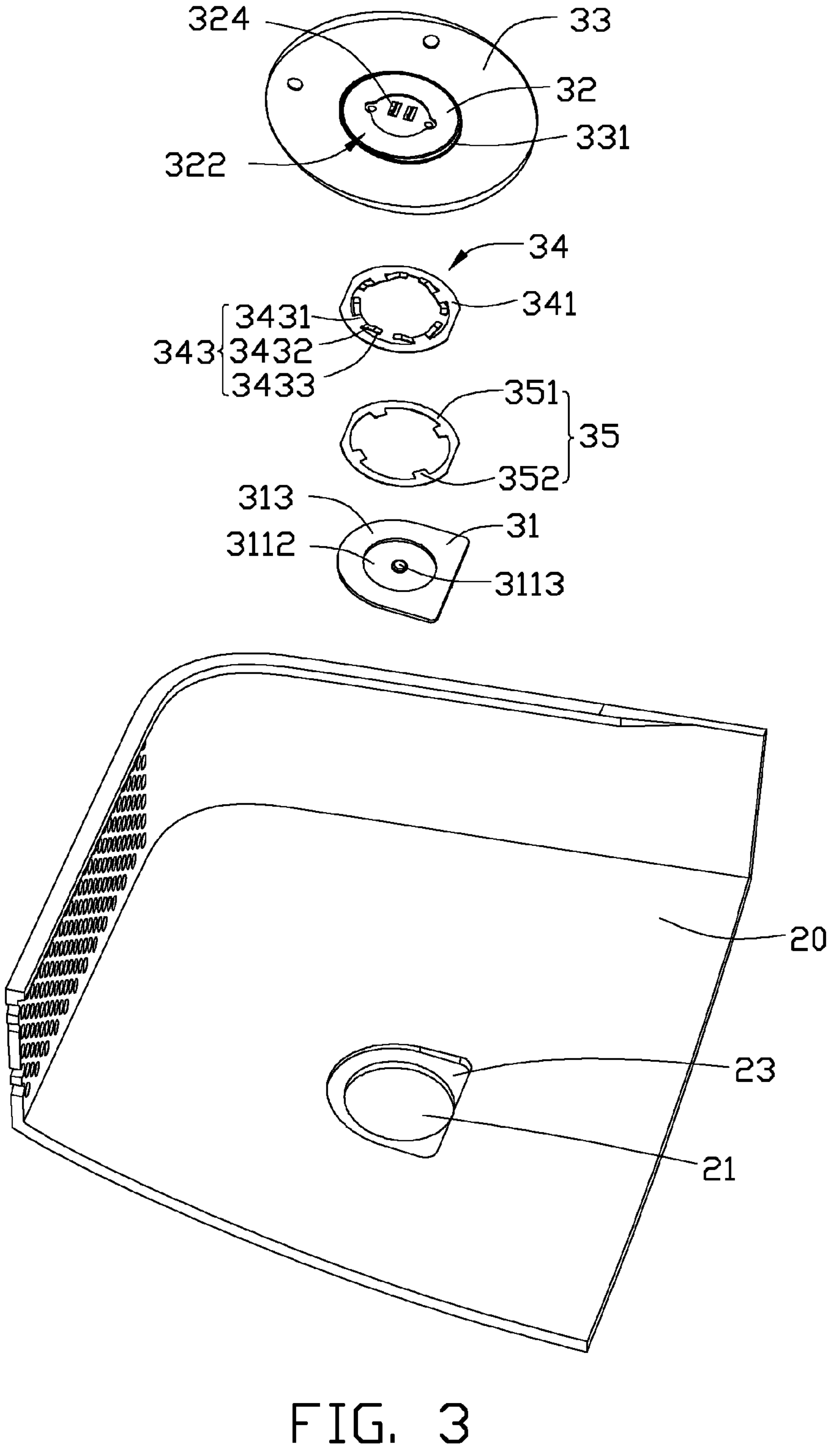
FIG. 3 is an exploded, isometric view of the electronic device of FIG. 2.
Figure 4:
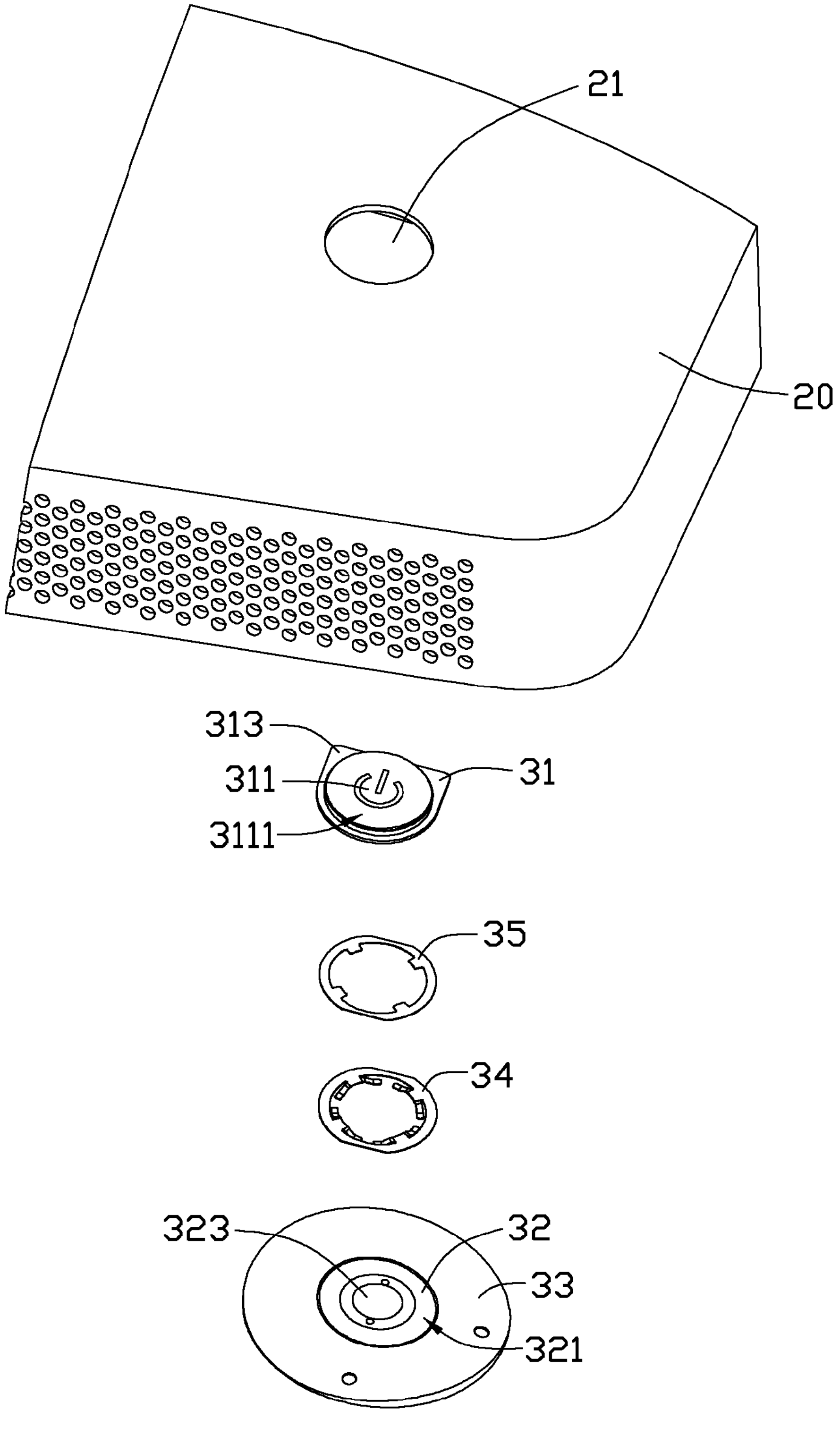
FIG. 4 is similar to FIG. 3, but viewed from another aspect.

Referring to FIGS. 3 and 4, the housing 20 defines a receiving hole 21, and an assembly portion 23 around the receiving hole 21. In the illustrated embodiment, the assembly portion 23 is substantially a U-shaped depression defined in an inner surface of the housing 20 around the receiving hole 21. The assembly portion 23 may be of other shapes, such as rectangular.

The power switch 30 includes an operating button 31, a printed circuit board 32, a support member 33, an elastic member 34, and an adhesive member 35.

The operating button 31 includes a pressing portion 311 and a connecting portion 313 around the pressing portion 311. The connecting portion 313 has the same shape as the assembly portion 23, and can be received in the assembly portion 23. The pressing portion 311 has a pressing surface 3111 and an inner surface 3112 opposite to the pressing surface 3111. The pressing portion 311 forms an electrical contact 3113 in a center of the inner surface 3112.

The printed circuit board 32 includes a first surface 321 and a second surface 322 opposite to the first surface 321. The first surface 321 forms an elastic connecting piece 323. In the illustrated embodiment, the elastic connecting piece 323 is a circular hollow protrusion (see FIG. 4). The second surface 322 forms two electrical contacts 324 which are insulated from each other (see FIG. 3). When the elastic connecting piece 323 is pressed, the elastic connecting piece 323 is deformed to contact the two electrical contacts 324, and then the electrical contacts 324 are electrically connected to each other. Next, the printed circuit board 32 generates a closed-circuit signal to a power supply (not shown).

The support member 33 defines a through hole 331 in a center portion thereof. The printed circuit board 32 is positioned in the through hole 331, and fixed to the support member 33. In the illustrated embodiment, the support member 33 is substantially circular, and made of metal.

The elastic member 34 includes an annular main body 341 and a plurality of resisting claws 343 extending from an inner side of the main body 341 and towards the printed circuit board 32. The resisting claws 343 stably support the printed circuit board 32. Each resisting claw 343 includes a connecting portion 3431 and two resisting arms 3432 extending from opposite sides of the connecting portion 3431. Each resisting arm 3432 forms a resisting end 3433 at an end of the resisting arm 3432 away from the connecting portion 3431. In the illustrated embodiment, the elastic member 34 has four resisting claws 343 evenly arranged at the inner side of the main body 341.

The adhesive member 35 includes an annular portion 351 and a plurality of ribs 352 extending from an inner side of the annular portion 351 corresponding to the connecting portions 3431. In the illustrated embodiment, the adhesive member 35 may be double-sided adhesive.

Referring to FIGS. 1 through 4, in assembly the power switch 30 to the housing 20, the operating button 31 is positioned in the assembly portion 23 with the pressing portion 311 extending through the receiving hole 21. The elastic member 34 is adhered to the operating button 31 via the adhesive member 35, and the connecting portions 3431 are attached to the ribs 352. The support member 33 is fixed to the housing 20, such that the support member 33 is supported by the resisting arms 3432 of the elastic member 34. In the illustrated embodiment, the support member 33 is adhered to the housing 20.

When an external force is applied to press the operating button 31, the operating button 31 is deformed, and then the electrical contact 3113 presses the elastic connecting piece 323 until the elastic connecting piece 323 connects the two electrical contacts 324. Therefore, the electrical contacts 324 are electrically connected to each other, and the power turns on, simultaneously the resisting claws 343 are compressed and generate an elastic force. Then, the external force is removed, and the elastic force generated by the resisting claws 343 drives the operating button 31 to go back to its original position. If the operating button 31 is pressed again, the power turns off.

In assembly of the power switch 30 to the housing 20, the elastic member 34 is first fixed to the operating button 31 via the adhesive member 35; therefore, the elastic member 34 can be quickly positioned in the assembly portion 23 together with the operating button 31, with the elastic member 34 aligned with the operating button 31.

While the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure, as defined by the appended claims.

What is claimed is:

1. An electronic device, comprising:

a housing defining a receiving hole; and a power switch, comprising:

an operating button received in the receiving hole;

a board;

an elastic member fixed to the operating button via an adhesive member, the elastic member comprising an annular main body, and a plurality of resisting claws extending from an inner side of the main body and towards the board, the resisting claws supporting the board, each resisting claw comprising a connecting portion extending from the inner side of the main body towards a center of the main body of the elastic member, and two resisting arms extending from opposite sides of the connecting portion and respectively towards the adjacent resisting claws; and a support member, wherein the power switch is positioned on the housing, the support member is connected to the board and fixed to the housing, such that the elastic member is sandwiched between the operating button and the board, and the support member is supported by the resisting arms of the plurality of the resisting claws.

2. The electronic device of claim 1, wherein the elastic member has four resisting claws evenly arranged at the inner side of the main body.

3. The electronic device of claim 1, wherein the board comprises a first surface and a second surface opposite to the first surface, the first surface forms an elastic connecting piece, and the second surface forms two electrical contacts insulated from each other; when the elastic connecting piece is pressed to connect the two electrical contacts, the electrical contacts are thereby conducted to each other.

4. The electronic device of claim 1, wherein the housing further defines an assembly portion around the receiving hole, and the elastic member is received in the assembly portion.

5. The electronic device of claim 1, wherein the operating button comprises a pressing portion and a connecting portion around the pressing portion, and the pressing portion extends through the receiving hole of the housing.

6. The electronic device of claim 1, wherein each resisting arm forms a resisting end at an end thereof away from the connecting portion.

7. The electronic device of claim 6, wherein the adhesive member comprises an annular portion and a plurality of ribs extending from an inner side of the annular portion, and the ribs are adhered to the connecting portions of the elastic member.

8. The electronic device of claim 7, wherein the adhesive member is double-sided adhesive.

9. A power switch comprising:

an operating button; and a board;

an elastic member fixed to the operating button via an adhesive member, wherein the elastic member comprises an annular main body, and a plurality of resisting claws extending from an inner side of the main body and towards the board, each resisting claw comprising a connecting portion extending from the inner side of the main body towards a center of the main body of the elastic member, and two resisting arms extending from opposite sides of the connecting portion and respectively towards the adjacent resisting claws, and the board is supported by the resisting claws.

10. The power switch of claim 9, wherein each resisting arm forms a resisting end at an end thereof away from the connecting portion.

11. The power switch of claim 9, wherein the board comprises a first surface and a second surface opposite to the first surface, the first surface forms an elastic connecting piece, and the second surface forms two electrical contacts insulated from each other; when the elastic connecting piece is pressed to connect the two electrical contacts, the electrical contacts are thereby conducted to each other.

12. The power switch of claim 9, wherein the operating button comprises a pressing portion and a connecting portion around the pressing portion.

13. The power switch of claim 9, wherein the elastic member has four resisting claws evenly arranged at the inner side of the main body.

14. The power switch of claim 13, wherein the adhesive member comprises an annular portion and a plurality of ribs extending from an inner side of the annular portion, and the ribs are adhered to the connecting portions of the elastic member.

15. The power switch of claim 14, wherein the adhesive member is double-sided adhesive.

* * * * *